(12) United States Patent
Coutellier et al.

(10) Patent No.: US 12,146,900 B2
(45) Date of Patent: Nov. 19, 2024

(54) CURRENT MEASUREMENT SYSTEM

(71) Applicant: LEM INTERNATIONAL SA, Meyrin (CH)

(72) Inventors: Damien Coutellier, Miribel (FR); Arnaud Labbe, St. Girod (FR); Atef Lekdim, Villeurbanne (FR); Albert Tournilhac, Chateauneuf de Galaure (FR)

(73) Assignee: LEM INTERNATIONAL SA, Meyrin (CH)

( * ) Notice: Subject to any disclaimer, the term of this patent is extended or adjusted under 35 U.S.C. 154(b) by 222 days.

(21) Appl. No.: 17/791,418

(22) PCT Filed: Jan. 8, 2021

(86) PCT No.: PCT/EP2021/050312
§ 371 (c)(1),
(2) Date: Jul. 7, 2022

(87) PCT Pub. No.: WO2021/140226
PCT Pub. Date: Jul. 15, 2021

(65) Prior Publication Data
US 2023/0029921 A1    Feb. 2, 2023

(30) Foreign Application Priority Data

Jan. 10, 2020 (EP) ..................... 20151245

(51) Int. Cl.
*G01R 15/18* (2006.01)
*G01R 35/00* (2006.01)

(52) U.S. Cl.
CPC ........... *G01R 15/18* (2013.01); *G01R 35/005* (2013.01)

(58) Field of Classification Search
CPC .......... H01B 5/02; G01R 33/00; G01R 33/09; G01R 33/02; G01R 15/18; G01R 35/00;
(Continued)

(56) References Cited

U.S. PATENT DOCUMENTS 6,348,800 B1    2/2002  Haensgen
2009/0039869 A1*  2/2009  Williams ................ H01L 24/48
                                                       324/123 R
(Continued)

FOREIGN PATENT DOCUMENTS

CN    112485496 A  *  3/2021  ............. G01R 1/067
DE    112015002438     3/2017
(Continued)

OTHER PUBLICATIONS

International Search Report and Written Opinion issued by the International Searching Authority, dated Apr. 28, 2021, for International Patent Application No. PCT/EP2021/050312; 20 pages.
(Continued)

*Primary Examiner* — Son T Le
(74) *Attorney, Agent, or Firm* — Faegre Drinker Biddle & Reath LLP

(57) ABSTRACT

A current measurement system comprising a multi-phase open loop current transducer for measuring phase currents ($I_1$, $I_2$, $I_3$) flowing in a plurality n of primary conductors of a multi-phase electrical system. The transducer comprises a housing, a magnetic core including first and second core parts and a plurality n+1 of magnetic field detectors mounted in the housing between the first and second core parts in which portions of the primary conductors traversing the current transducer housing are positioned. The system further comprises a non-volatile memory in which information on at least one coupling matrix (K), pre-defined in a calibration procedure, is stored.

15 Claims, 5 Drawing Sheets

(58) Field of Classification Search
CPC .. G01R 35/005; G01R 15/183; G01R 15/186; G01R 19/00; G01R 19/0092; G01R 19/25; G01R 19/2509; G01R 19/2513; G01R 15/20; G01R 15/207; G01R 19/165; G01R 19/16528; G01R 31/52; G01R 11/40; G01R 33/341; G01R 33/3415

See application file for complete search history.

(56) References Cited

U.S. PATENT DOCUMENTS

| | | |
|---|---|---|
| 2009/0128129 A1 | 5/2009 | Aratani |
| 2013/0214593 A1 | 8/2013 | Ohashi |
| 2014/0015524 A1 | 1/2014 | Lorenz |
| 2015/0260762 A1* | 9/2015 | Sakamoto ............ G01R 15/207 324/117 R |
| 2017/0082661 A1 | 3/2017 | Schulz |

FOREIGN PATENT DOCUMENTS

| | | |
|---|---|---|
| EP | 2546660 | 1/2013 |
| EP | 3364208 | 8/2018 |
| GB | 2547732 | 8/2017 |
| JP | H0545384 A * | 2/1993 |
| JP | 2019158631 A * | 9/2019 |
| KR | 101488690 | 2/2015 |
| WO | 1989/09411 | 10/1989 |
| WO | 2020/008922 | 1/2020 |

OTHER PUBLICATIONS

Meng, et al., "Magnetic Sensor Array-Based AC Current Measurement for Multiconductor Cables Using Evolutionary Computation Method", IEEE Transactions on Instrumentation and Measurement, vol. 64., No. 10, Oct. 1, 2015; 12 pages.

Chirtsov, et al., "Three-Phase Busbar Current Transducer", IEEE Magnetics Letters, vol. 10, Dec. 3, 2019; 5 pages.

* cited by examiner

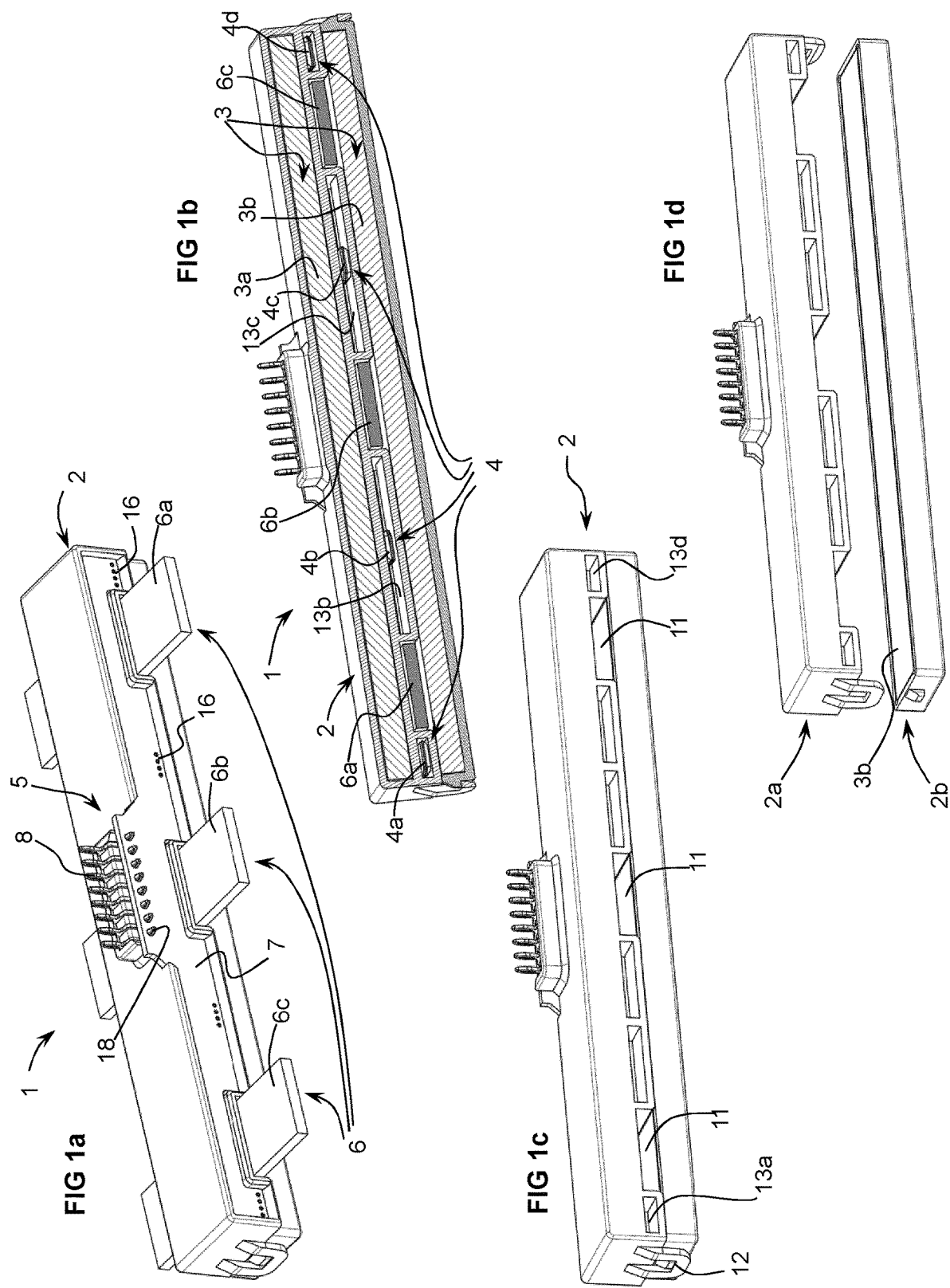

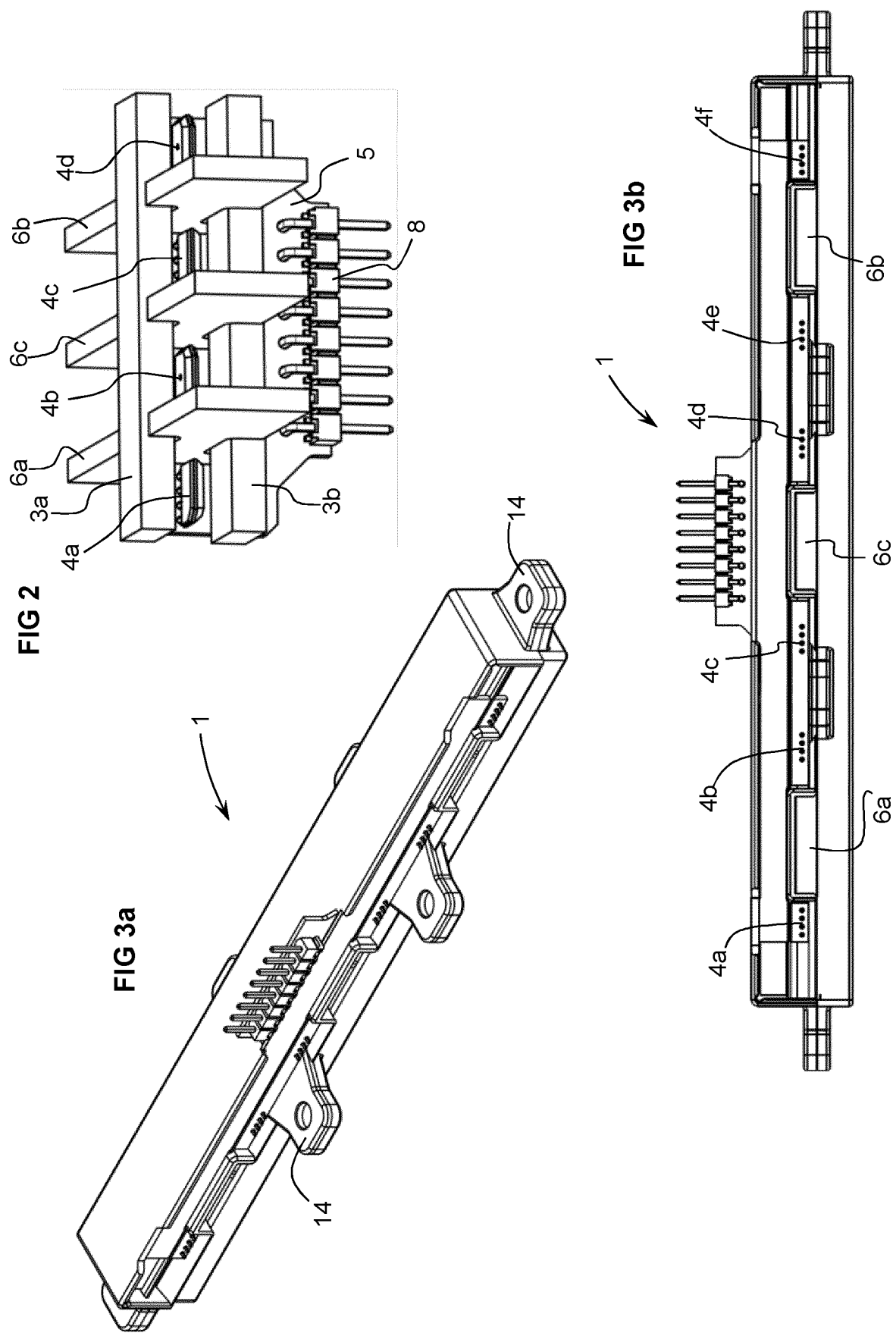

CURRENT MEASUREMENT SYSTEM

CROSS-REFERENCE TO RELATED APPLICATIONS

The present application is a national stage entry of International (PCT) Patent Application Number PCT/EP2021/050312, filed Jan. 8, 2021, which claims priority to European Patent Application Number 20151245.6, filed Jan. 10, 2020, the complete disclosures of which are expressly incorporated herein by reference.

The present invention relates to a current measurement system for a multi-phase electrical system, comprising a multi-phase open-loop current transducer.

Many electrical systems are supplied by multi-phase electrical currents, in particular three-phase currents, such systems including for instance electrical motors in mobile applications such as electrical vehicles. In such applications, there is a need for robust and reliable current sensors but that are also economical to manufacture and install.

Safety is an important factor, whereby the current sensor should detect faults rapidly and reliably, in order for control systems to shut down or change settings of a faulty system. Overcurrents and leakage currents are typically indicative of a faulty electrical system.

The effect of external magnetic fields, that may for instance originate from other electrical conductors and components in proximity to the current sensor, should not adversely affect the accuracy and reliability of the current sensor.

Current sensors implemented in harsh environments, such as found in electrical vehicles, also need to withstand mechanical shock, vibration, and large thermal variations.

It is a challenge with existing sensors to respond to the needs of economical manufacturing and installation, while also satisfying the high requirements for safety, durability, reliability and accurate current measurement.

It is known to provide three-phase open-loop current transducers comprising magnetic core parts assembled on opposing sides of three primary conductors arranged in a common plane in order to generate an output of the current in each of the phases. It is noted that if the current in two of the phases is measured, the current in the third phase may be deduced from the two other phases. Conventional open-loop current transducers of this sort are however relatively costly to install and to drive, and may also lack the necessary response time in order to address faults rapidly. Moreover, detection of transducer malfunction may not be reliable.

In view of the foregoing, it is an object of the invention to provide a multi-phase (in particular three-phase) current measurement system with an open-loop current transducer that is economical to produce and install, yet is robust, safe and reliable while ensuring accurate measurement.

It is advantageous to provide a multi-phase current measurement system that is able to detect faults very rapidly, in particular leakage currents or overcurrents.

It is advantageous to provide a multi-phase open-loop current transducer of a multi-phase current measurement system that is compact.

Objects of the invention have been achieved by providing a multiphase current measurement system according to claim 1.

Objects of the invention have been achieved by providing a method of measuring a plurality of currents flowing in a plurality n of primary conductors of a multi-phase electrical system according to claim 14.

Disclosed herein is a current measurement system comprising a multi-phase open loop current transducer for measuring phase currents ($I_1$, $I_2$, $I_3$) flowing in a plurality n of primary conductors of a multi-phase electrical system. The transducer comprises a housing, a magnetic core including first and second core parts and a plurality n+1 of magnetic field detectors mounted in the housing between the first and second core parts in which portions of the primary conductors traversing the current transducer housing are positioned. The system further comprises a non-volatile memory in which information on at least one coupling matrix (K) of dimension n×n+1, pre-defined in a calibration procedure, is stored, said at least one coupling matrix linking the phase currents ($I_1$, $I_2$, $I_3$) flowing in the primary currents to magnetic induction fields ($B_1$, $B_2$, $B_3$, $B_4$) detected by said magnetic field detectors, and a computation unit configured to compute the values of said n phase currents from the outputs of said n+1 magnetic field detectors using the coupling matrix. The computation unit is further configured to estimate n phase currents in a degraded mode using n+1 degraded mode coupling matrices, each of dimension n×n based on the outputs of a subset n of said n+1 magnetic field detectors, that allows detection of faults in the magnetic field detectors, leakage currents, or overcurrents.

Also disclosed herein is a method of measuring a plurality of currents ($I_1$, $I_2$, $I_3$) flowing in a plurality n of primary conductors of a multi-phase electrical system, comprising:
  providing a current measurement system comprising a transducer including a housing, a magnetic core including first and second magnetic core parts, and a plurality n+1 of magnetic field detectors mounted in the housing between the first and second core parts in which portions of the primary conductors traversing the current transducer housing are positioned, the transducer connected to a circuit of the multi-phase electrical system;
  executing, prior to operation of the transducer for measuring said phase currents flowing in said primary conductors, a calibration method to compute at least one coupling matrix (K) of dimension n×n+1 linking the phase currents ($I_1$, $I_2$, $I_3$) flowing in the primary currents to magnetic induction fields ($B_1$, $B_2$, $B_3$, $B_4$) detected by said magnetic field detectors;
  storing said at least one coupling matrix in a non-volatile memory of the transducer or of said circuit of the multi-phase electrical system;
  computing, in a computation unit of the current measurement system, during operation of the transducer for measuring said phase currents flowing in said primary conductors, the values of said n phase currents from measurement outputs of said n+1 magnetic field detectors using said at least one coupling matrix;
  computing, in said computation unit, a redundant measurement of the plurality of currents ($I_1$, $I_2$, $I_3$) using degraded mode coupling matrixes of dimension n×n to detect faults in the magnetic field detectors, n among n+1 magnetic field detectors for an n phase system being used to compute n+1 degraded mode coupling matrixes ($K_{123}$ $K_{124}$ $K_{134}$ $K_{234}$).

In an advantageous embodiment, said non-volatile memory in which information on at least one coupling matrix (K) is stored, is provided in at least one application specific integrated circuit (ASIC) forming at least one of said magnetic field detectors, or is provided in a memory of a circuit of the transducer.

In an advantageous embodiment, said non-volatile memory in which information on at least one coupling matrix (K) is stored, is readable via a connector of the current transducer by an external circuit, for transmission of said information on said at least one coupling matrix to said external circuit and for computation of the values of the phase currents in said external circuit.

In an advantageous embodiment, said non-volatile memory in which information on at least one coupling matrix (K) is stored is arranged in said electrical system externally to the transducer.

In an advantageous embodiment, the system further comprises a computation unit configured to execute at least two different computation methods to estimate currents, including for instance a pseudo inverse method such as the Moore-Penrose inverse computation and a differential method.

In an advantageous embodiment, the first and second magnetic core parts are in the form of substantially straight rectangular bars formed of a stack of laminated soft magnetic material sheets.

In an advantageous embodiment, each of the magnetic core parts is received in a respective housing part, that are formed as separate parts that are assembled together, one of the housing parts housing the plurality of magnetic field detectors and the primary conductor portions extending through the housing.

In an advantageous embodiment, passages through which the primary conductors extend are formed by recesses or through-cavities in said one of the housing parts, the other housing part having an essentially planar mating face.

In an advantageous embodiment, the transducer comprises a circuit board arranged in a plane substantially orthogonal to the plane in which the airgap between said magnetic core parts is formed, along a side of the housing that overlaps connection terminals of the magnetic field detectors.

In an advantageous embodiment, the magnetic field detectors are pre-assembled to the circuit board during manufacturing, whereby during assembly of the circuit board against the housing base part, the magnetic field detectors are inserted into cavities in the housing part for receiving the magnetic field detectors, said cavities including cavities positioned on either outer side of the primary conductors and cavities between adjacent primary conductors.

In an advantageous embodiment, the transducer is for a three-phase electrical system and comprise four magnetic field detectors, two being arranged on outer sides of the three primary conductors and each of the other two being arranged between respective adjacent primary conductors.

In an advantageous embodiment, the magnetic field detectors are in the form of ASICs.

In an advantageous embodiment, a comparator may be connected to each magnetic field detector configured to generate a control signal at specific voltage thresholds determined for each magnetic field detector to generate a shut down control signal for an electrical system controlled by the current in case of an electrical fault or overcurrent.

In an advantageous embodiment, a computation unit of a circuit of the current measurement system executes a differential measurement for each phase current, where the coupling matrix K' for the differential measurement is determined with the calibration method.

In an advantageous embodiment, the degraded mode matrices are formed of n×n coefficients.

Further objects and advantageous features of the invention will be apparent from the claims, from the detailed description, and annexed drawings, in which:

FIG. 1a is a perspective view of a current transducer of a current measurement system according to an embodiment of the invention;

FIG. 1b is a cross-sectional view through the current transducer of FIG. 1a;

FIG. 1c is a perspective view of the current transducer of FIG. 1a without primary conductor portions;

FIG. 1d is a view of the transducer of FIG. 1a with base and cover parts disassembled;

FIG. 2 is a perspective view of a variant of current transducer according to an embodiment of the invention with housing parts removed;

FIG. 3a is a perspective view of a current transducer according to another embodiment of the invention;

FIG. 3b is a view of a side of the transducer of FIG. 3a;

Figure 4:
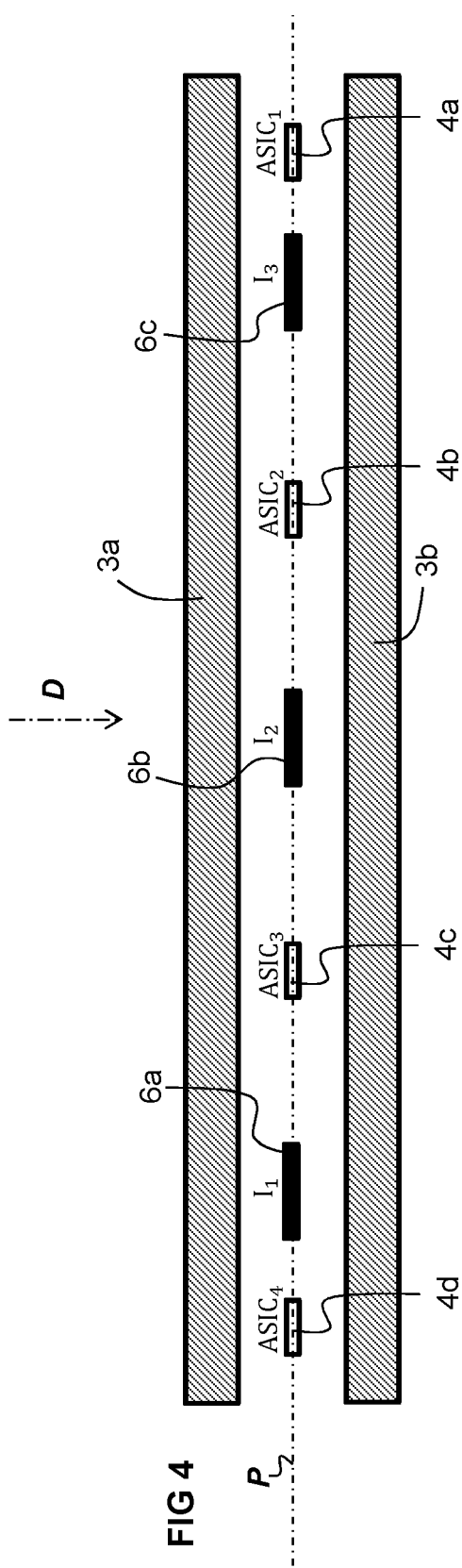
FIG. 4 is a simplified schematic view illustrating magnetic core parts, magnetic field detectors and primary conductors of a current transducer according to embodiments of the invention.

A current measurement system according to embodiments of the invention comprises a current transducer 1 for connection to a circuit (not shown) of an electrical system (not shown). The electrical system may for instance be an electrical motor or a controller of an electric motor or other type of electrical machine. The current measurement system comprises circuit elements for processing the measurement signals that includes a computation unit. The computation unit may either be comprised within the transducer 1, or be part of the electrical system for processing of the measurement signal externally to the transducer. In the latter embodiment, the current transducer 1 may output measurement signals from each magnetic field detector 4 that are then processed in the circuit external to the transducer to compute the current measurement values of the current flowing in the primary conductors.

The computation unit may include or consist of any form of computing device (integrated circuit, FPGA, microcontroller etc) suitable for performing calculations and processing the measurement signals.

Referring to the figures, starting in particular with FIGS. 1a to 4, a multi-phase, in this case three-phase, open-loop current transducer 1 according to embodiments of the invention comprises a housing 2, a magnetic core 3 including first and second core parts 3a, 3b, and a plurality of magnetic field detectors 4 mounted in the housing 2.

The current transducer may optionally further comprise a signal processing circuit 5 connected to the magnetic field detectors 4, and may optionally comprise a plurality of primary conductor portions 6a, 6b, 6c integrated or pre-assembled to the current transducer.

The circuit 5 may, in embodiments, comprise circuit traces to interconnect the magnetic field detectors to a connector for connection to external circuitry, however without electronic components for signal processing, the signal processing being performed in a circuit of an electrical system to which the transducer is connected.

In an embodiment, the current transducer may be provided without primary conductor portions, configured for assembly around primary conductors 6 of a multiphase electrical system (not shown), the current transducer housing comprising passages 11 for receiving the external primary conductors 6 therethrough. In the illustrated embodiments, the current transducer is for a three-phase electrical system, for instance for control of a three-phase electrical motor. The primary conductors carry the current to be measured. Within the scope of the invention it is however also possible to have a two-phase, four-phase, five-phase, six phase or higher number of phases current transducer employing the principles described with respect to the three-phase embodiment.

The magnetic core parts 3a, 3b are made of a material with high magnetic permeability, in particular a soft magnetic material such as FeSi alloy or FeNi, such magnetic materials being per se well known.

The magnetic core parts 3a, 3b may advantageously be in the form of straight or substantially straight rectangular bars which are particularly economical to manufacture, for instance by a stamping operation of soft magnetic material sheets that are stacked to form the bar.

The magnetic core parts 3a, 3b from therebetween an airgap in which the primary conductors 6 and magnetic field detectors 4 are positioned. The airgap extends substantially along a plane P, whereby in an advantageous embodiment, the primary conductors and magnetic field detectors may be substantially aligned along the plane P.

In an advantageous embodiment, the magnetic core parts may be identical to further reduce manufacturing costs and simplify the number of parts used in the production of the current transducer.

The magnetic field detectors 4 may advantageously be in the form of application specific integrated circuits (ASICs) in which an integrated circuit comprising a magnetic field detector is overmolded and connected to connection pins for power and signal transmission, such ASICs being per se well-known in the field of current transducers. The ASIC may typically be based on a Hall effect detector, also per se well-known. In embodiments, other magnetic field detectors such as TMR (tunnelling magnetoresistance) or GMR (Giant magnetoresistance) can be used.

Each of the magnetic core parts 3a, 3b is received in a respective housing part 2a, 2b, that, in an advantageous embodiment may be formed as separate parts that are assembled together and fixed by latching elements 12 or other fixing members (such as screws or clamps), or the housing parts may be fixed together by welding or bonding such that they are inseparable after assembly.

In a variant, as illustrated, the housing parts may be assembled together in-situ, for instance for mounting around primary conductors of an external system.

In a variant where primary conductor portions 6a, 6b, 6c are directly integrated in the current transducer, the housing parts 2a, 2b could be permanently molded, welded or arranged around the primary conductor portions prior to assembly of the current transducer in an external installation for connection to external primary conductors carrying the currents to be measured.

The magnetic core parts 3a, 3b positioned either side of the magnetic field detectors 4 have a width and length sufficient to completely cover and extend beyond the surface area of the magnetic field detectors when viewed in a direction D orthogonal to the plane P in which the primary conductors 6 and magnetic field detectors are aligned, such that external magnetic fields, for instance due to electrical components in proximity to the current transducer, are substantially evenly distributed in the airgap between the two core parts 3a, 3b. The magnetic core parts 3a, 3b have a cross-section configured to be sufficient to not saturate with high reliability at the specified maximum current to be measured by the transducer.

As will discussed hereinafter, a differential measurement using the magnetic field detectors allows to eliminate the magnetic field value originating from the external field.

The passages 11 through which the primary conductors 6, 6a, 6b, 6c extend may be formed by a recess or through cavities in one of the housing parts 2a (base part 2a), the other housing part 2b having an essentially planar mating face that couples to the mating face of the base part 2a. The primary conductors 6a, 6b, 6c may for instance be provided in the shape of rectangular bars as illustrated, however cylindrical, oval, trapezoidal or other profile shapes of the primary conductor bars may be provided.

The coupling face of the second housing part 2b with a magnetic core part 3b assembled therein may be coated or provided with an insulation layer to insulatingly separate the magnetic core part 3b from the primary conductors 6a, 6b, 6c.

The circuit 5 comprises a circuit board 7 which may advantageously be arranged in a plane substantially orthogonal to the plane P along which the airgap is aligned, along a side 13 of the housing that overlaps the connection terminals of the magnetic field detectors 4.

The magnetic field detectors 4 may be pre-assembled to the circuit board 7 during manufacturing, whereby during assembly of the circuit board against the housing base part 2a, the magnetic field detectors 4 are inserted into cavities 13 in the housing part for receiving the magnetic field detectors, said cavities including cavities 13a, 13d positioned on either outer side of the primary conductors and cavities 13b, 13c between adjacent primary conductors. For a three-phase electrical system there are therefore four magnetic field detectors 4a, 4b, 4c, 4d and in a specific advantageous embodiment they are in the form of ASICs (denoted ASIC1, ASIC2, ASIC3, ASIC4 herein).

The housing 2 may comprise other elements for instance mountings lugs 14 for fixing the current transducer to external supports.

The circuit 5 further comprises a connector 8 for connection to external circuitry, including power supply to drive the signal processing circuit and magnetic field detectors of the current transducer, and for receiving current measurements outputs from the current transducer.

In the illustrated embodiment, the connector 8 comprises a housing portion directly integrated in the housing base part 2a and comprising pin terminals for connection to an external circuit board or for plugging connection to an external connector. Other types of contacts may be provided for plugging or for clamped or soldered connections as per se known in the art of connection systems.

In an embodiment, the circuit board 7 of the circuit 5 comprises contact portions for the magnetic field detectors 16 that are interconnected via circuit traces to electronic components on the circuit board that allow for processing or pre-processing of the measurement signals prior to output via the connector 8. A micro-controller for signal processing may for instance be mounted on the circuit board 7. In another embodiment, the circuit board 7 of the circuit 5 comprises contact portions for the magnetic field detectors 16 that are interconnected via circuit traces to the connector 8, whereby processing of the measurement signals output by the magnetic field detectors is performed in an external circuit to which the transducer is connected.

Figure 7:
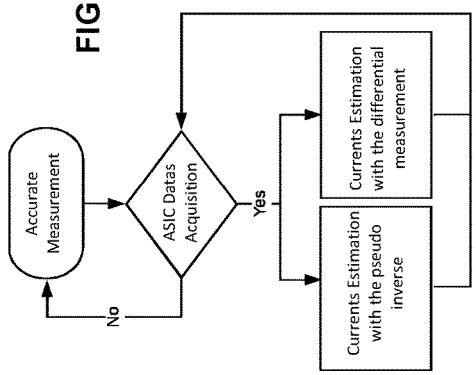
FIG. 7 is a flow chart illustrating a measurement procedure for a current transducer according to embodiments of the invention.

A computation unit implemented in the transducer or externally in a circuit of the electrical system to which the transducer is connected, depending on the embodiment, may advantageously be configured to execute several methods to process the currents measured by the plurality of magnetic field detectors to obtain accurate primary current values for each of the phases, for instance as illustrated in FIG. 7.

Figure 5:
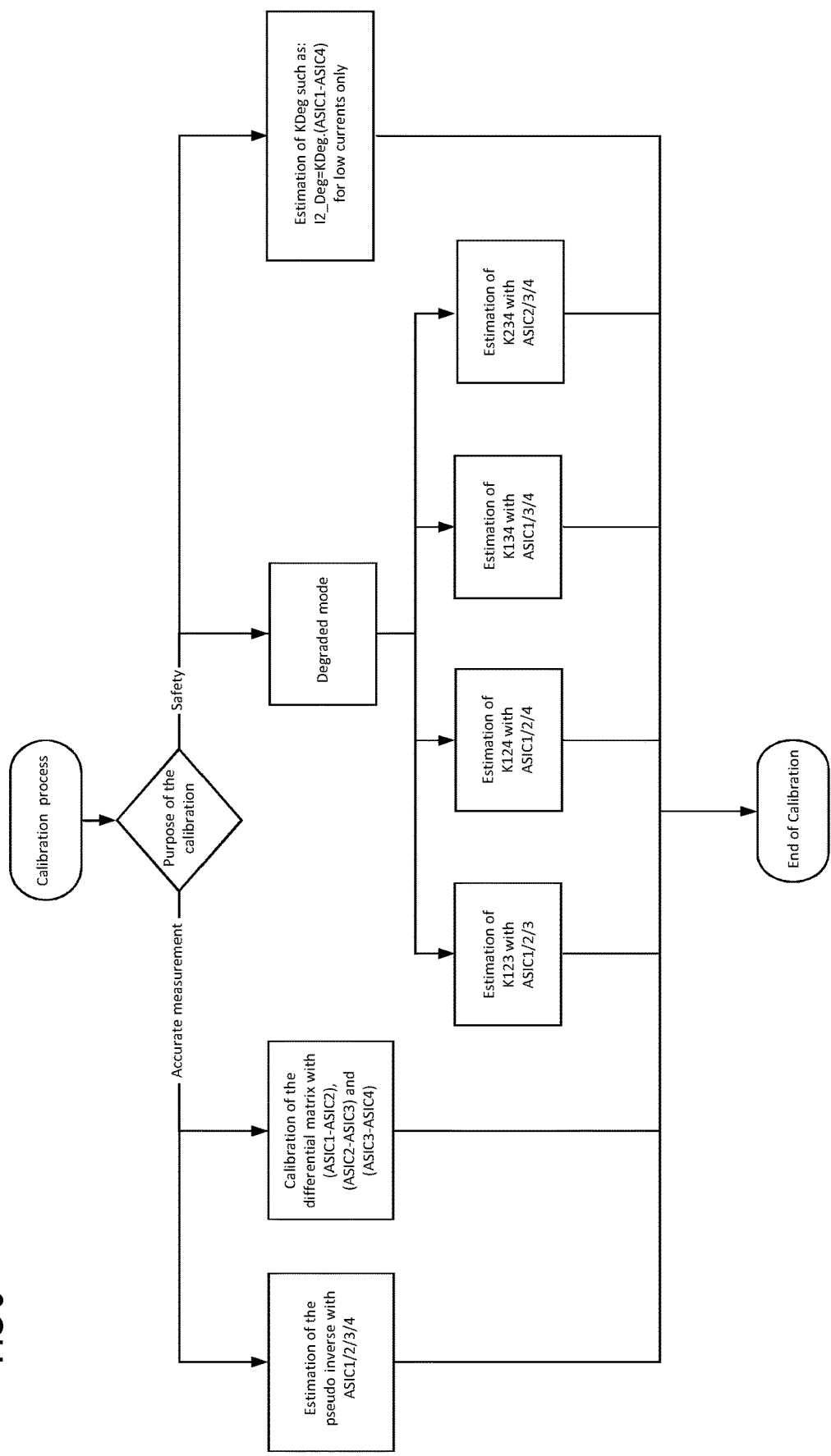
FIG. 5 illustrates a flow chart of a calibration method for a current transducer according to embodiments of the invention.

In an advantageous embodiment, the methods include a pseudo inverse method and a differential method. For both methods, and other methods that may be used within the scope of the invention, a calibration procedure as illustrated in FIG. 5 is executed to determine a coupling matrix K linking the phase currents $I_1$, $I_2$, $I_3$ flowing in the primary conductors to the magnetic induction fields B1, B2, B3, B4 seen by the magnetic field detectors 4a, 4b, 4c, 4d (ASIC1, ASIC2, ASIC3, ASIC4). The coupling matrix may be a rectangular matrix of n×n+1 coefficients, where n is the number of phases to be measured and n+1 the number of magnetic field detectors.

The pseudo inverse method may advantageously perform a computation using the known Moore-Penrose inverse, which is useful for the inversion of non-invertible matrices, including rectangular matrices. This method uses a pseudo-inverse matrix $K^+$ of the coupling matrix K for the magnetic induction fields {$B_1$, $B_2$ $B_3$, $B_4$} seen by the magnetic field detectors ASIC1, ASIC2, ASIC3, ASIC4. It may be noted that this method is expressed as the actual flux density measured by the ASIC, it can also be expressed as the output signal of the ASIC (that can be a voltage $V_1$, $V_2$, $V_3$, $V_4$ signal, or a current signal, that may or may not comprise offset in the signal).

$$B = \begin{pmatrix} B_1 \\ B_2 \\ B_3 \\ B_4 \end{pmatrix} \quad K = \begin{pmatrix} k_{11} & k_{12} & k_{13} \\ k_{21} & k_{22} & k_{23} \\ k_{31} & k_{32} & k_{33} \\ k_{41} & k_{42} & k_{43} \end{pmatrix} \quad I = \begin{pmatrix} I_1 \\ I_2 \\ I_3 \end{pmatrix}$$

$$B = KI \Rightarrow I = K^+ B$$

Hence, $K^+$ is figured as below:

$$K^+ = {}^t K (K^t K)^{-1}$$

This method allows finding directly a unique matrix which makes a link between I and B, whereby the coupling matrix may be determined during a calibration process that is preferably performed during or after production of the transducer, before operation of the transducer for current measurement when connected to a circuit of an electrical system.

According to an advantageous aspect of the invention, the coupling matrix may be stored in a non-volatile memory of the circuit 5, or in a non-volatile memory of one or more of the ASICs. The transducer thus contains the information on the coupling matrix. The information on the coupling matrix may, in a first embodiment, be used to compute the current measurement within the transducer in the case of an embodiment comprising a signal processing circuit with a computation unit configured to output current measurement values.

In another embodiment, the information on the coupling matrix stored in the transducer may be transmitted to a circuit of an electrical system (not shown) to which the transducer is connected for processing of the current measurement signal in the electrical system.

In another embodiment, the information on the coupling matrix may be stored in a circuit of the electrical system externally of the transducer, the coupling matrix being specific to the transducer and loaded in a memory of the circuit after performing the calibration procedure on said transducer.

The values of the coupling matrix, which are determined during a calibration process for each transducer, or each production batch of transducers, prior to use of the transducer for current measurement in an electrical system to which the transducer is connected, advantageously provides matrix values that are adjusted for each transducer, or for a production batch of transducers. The matrix values thus take into account manufacturing and material tolerances and differences of each transducer, thus providing accurate measurement values for each transducer when in use for measuring currents in the electrical system.

In most cases an external magnetic field produces substantially the same flux all along the central air gap between magnetic core parts 3a, 3b. In such case, it is possible to remove the effect of this field in the current measurement, for instance using the method described below. The principle is to make a differential measurement for each current, where the coupling matrix K' for the differential measurement may be determined with the same calibration method as described above (although in the formula below the output voltage signal $V_1$, $V_2$, $V_3$, $V_4$ of the ASICs, which are images of the measured magnetic induction $B_1$, $B_2$, $B_3$, $B_4$, are used instead)

$$\begin{pmatrix} V_4 - V_3 \\ V_3 - V_2 \\ V_2 - V_1 \end{pmatrix} = K' \cdot \begin{pmatrix} I_1 \\ I_2 \\ I_3 \end{pmatrix}$$

K' is square and thus invertible, hence currents are estimated as below:

$$\begin{pmatrix} I_1 \\ I_2 \\ I_3 \end{pmatrix} = (K')^{-1} \cdot \begin{pmatrix} V_4 - V_3 \\ V_3 - V_2 \\ V_2 - V_1 \end{pmatrix}$$

Advantages of the method are:
Having a square K' matrix (simpler to compute)
Having a differential measurement for each current (removes the effect of the external field on the measurement result)
After an analysis of the differential coupling matrix K', the coefficient representing the output of the ASIC closest to a phase conductor is significantly higher, for instance around 1000 times higher, than other coefficients of ASICs further away from said phase conductor. It means that using the two closest ASIC surrounding a phase conductor is enough to perform a differential measurement and it is not necessary to use the other ASICs to have a good measurement. In other words, coupling coefficients from distal ASICs can be neglected with regards to the coupling coefficients from proximate ASICs Hence, it is possible to simplify the problem with only three coefficients as below:

$$I_1 \approx k'_{11} \cdot (V_4 - V_3) \quad I_2 \approx k'_{22} \cdot (V_3 - V_2) \quad I_3 \approx k'_{33} \cdot (V_2 - V_1)$$

-continued $$K^{-1} = \begin{pmatrix} k'_{11} & k'_{12} & k'_{13} \\ k'_{21} & k'_{22} & k'_{23} \\ k'_{31} & k'_{32} & k'_{33} \end{pmatrix}$$

To provide a redundancy of the measurement and to detect faults in the magnetic field detectors 4, a number n of n+1 magnetic field detectors for an n phase system, for instance in the present example three among four magnetic field detectors (for a three phase system), may be used to define n+1 new degraded mode matrixes (i.e four in the present example) which may then be used to estimate the phase currents in another mode, named herein a degraded mode:

$K_{123}\ K_{124}\ K_{134}\ K_{234}$ $$\text{With } \begin{pmatrix} I_1 \\ I_2 \\ I_3 \end{pmatrix}_{abc} = K_{abc}^{-1} \cdot \begin{pmatrix} B_a \\ B_b \\ B_c \end{pmatrix} \{a, b, c\} \in [\![1; 4]\!]$$

The n+1 degraded mode coupling matrices $K_{abc}$ may be square matrices of n×n coefficients, where n is the number of phases to be measured and n+1 the number of magnetic field detectors Because each degraded mode coupling matrix $K_{abc}$ is a square matrix, it is possible to inverse it directly. The current matrix $I_{abc}$ doesn't give a precise estimation of currents, but it allows to detect a fault of a magnetic field detector. The degraded mode coupling matrices $K_{abc}$ are composed of n lines (Moore Penrose K matrix):

$$K = \begin{pmatrix} k_{11} & k_{12} & k_{13} \\ k_{21} & k_{22} & k_{23} \\ k_{31} & k_{32} & k_{33} \\ k_{41} & k_{42} & k_{43} \end{pmatrix}$$

$$K_{123} = \begin{pmatrix} k_{11} & k_{12} & k_{13} \\ k_{21} & k_{22} & k_{23} \\ k_{31} & k_{32} & k_{33} \end{pmatrix} K_{124} = \begin{pmatrix} k_{11} & k_{12} & k_{13} \\ k_{21} & k_{22} & k_{23} \\ k_{41} & k_{42} & k_{43} \end{pmatrix}$$

$$K_{134} = \begin{pmatrix} k_{11} & k_{12} & k_{13} \\ k_{31} & k_{32} & k_{33} \\ k_{41} & k_{42} & k_{43} \end{pmatrix} K_{234} = \begin{pmatrix} k_{21} & k_{22} & k_{23} \\ k_{31} & k_{32} & k_{33} \\ k_{41} & k_{42} & k_{43} \end{pmatrix}$$

Figure 6:
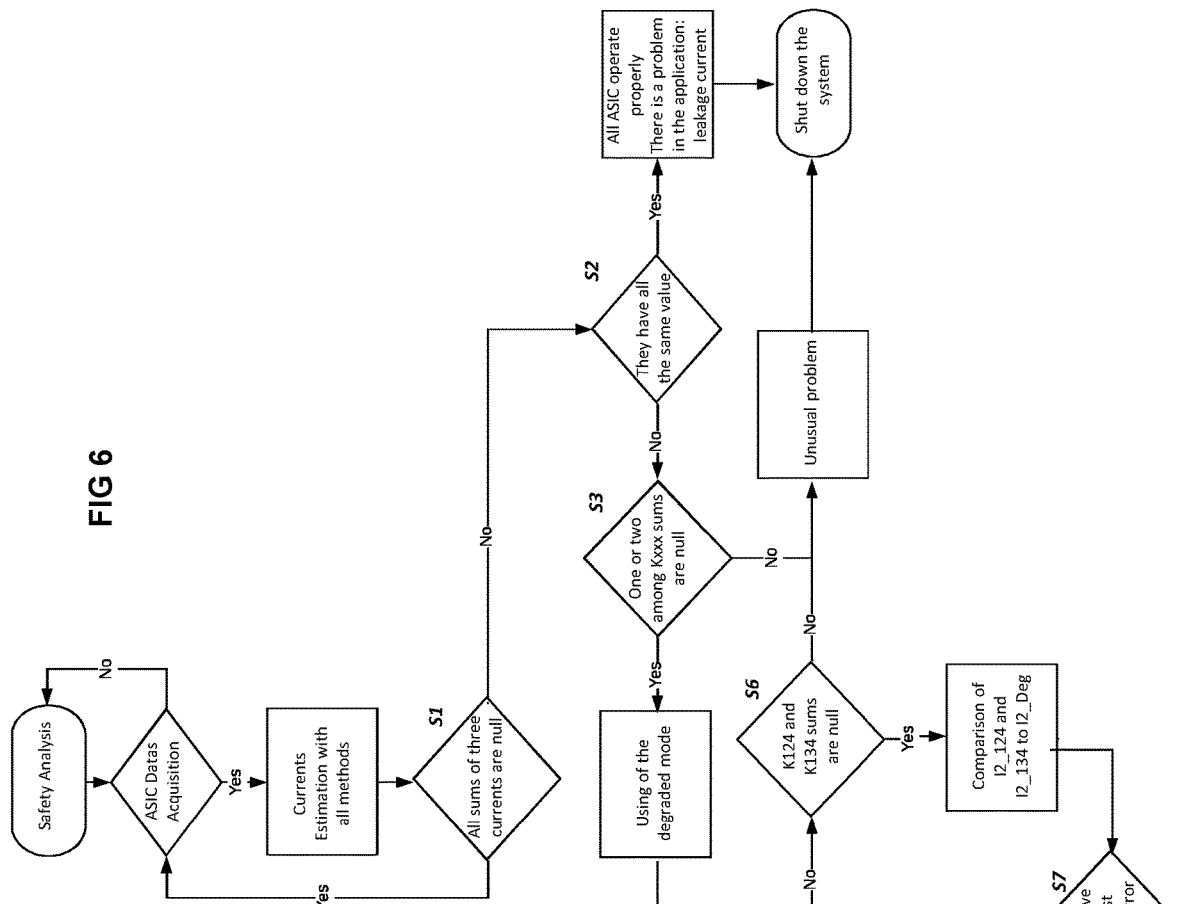
FIG. 6 is a flow chart of a safety analysis procedure for a current transducer according to embodiments of the invention.

If a magnetic field detector is faulty, the error will affect the computed value of a specific phase current $I_1$, $I_2$, or $I_3$ value depending which of the degraded mode coupling matrices is used. Hence it is possible, with the comparison of these phase currents $I_1$, $I_2$, $I_3$, computed with the degraded mode coupling matrices to determine the origin of the fault. Moreover, this method allows detecting leakage currents. This safety analysis method illustrated in FIG. 6 is described below:

1. Phase currents $I_1$ $I_2$ $I_3$ are estimated with degraded mode coupling matrices $K_{123}$ $K_{124}$ $K_{134}$ $K_{234}$ $K_{Pseudo}$ and $K_{Diff}$
2. The sum of the three phase currents for each matrix is made
3. If all these sums (S1) are null, $(I_1)_{123}+(I_2)_{123}+(I_3)_{123}=0$

AND $(I_1)_{124}+(I_2)_{124}+(I_3)_{124}=0$

AND $(I_1)_{134}+(I_2)_{134}+(I_3)_{134}=0$

AND $(I_1)_{234}+(I_2)_{234}+(I_3)_{234}=0$

AND $(I_1)_{Pseudo}+(I_2)_{Pseudo}+(I_3)_{Pseudo}=0$

AND $(I_1)_{Diff}+(I_2)_{Diff}+(I_3)_{Diff}=0$ then there should be no problem.
4. If all these sums (S2) have the same value, $(I_1)_{123}+(I_2)_{123}+(I_3)_{123}=(I_1)_{124}+(I_2)_{124}+(I_3)_{124}=I_{leakage}$ then there is a leakage current in the system being measured which has the magnitude of said value.
5. If one or two of these sums (S3) are null, $(I_1)_{123}+(I_2)_{123}+(I_3)_{123}=0$ $OR (I_1)_{124}+(I_2)_{124}+(I_3)_{124}=0$ $OR (I_1)_{134}+(I_2)_{134}+(I_3)_{134}=0$ $OR (I_1)_{234}+(I_2)_{234}+(I_3)_{234}=0$ then a magnetic field detector is faulty and a degraded mode may be used to determine which magnetic field detector is faulty.
  5.1 If the sum of currents from $K_{123}$ is null (S4), $(I_1)_{123}+(I_2)_{123}+(I_3)_{123}=0$ then the magnetic field detector ASIC4 is faulty and this degraded mode matrix only needs to be used because this matrix does not use the faulty ASIC to compute the current.
  5.2 If the sum of currents from $K_{234}$ is null (S5)

$(I_1)_{234}+(I_2)_{234}+(I_3)_{234}=0$ then the magnetic field detector ASIC1 is faulty and this matrix only needs to be used
  5.3 If the sum of currents from $K_{124}$ and $K_{134}$ are null (S6), $(I_1)_{124}+(I_2)_{124}+(I_3)_{124}=0$

AND $(I_1)_{134}+(I_2)_{134}+(I_3)_{134}=0$ then either of the magnetic field detectors ASIC2 or ASIC3 are faulty
    5.3.1 For low currents (<300 A), $I_2$ can be estimated as follow: $(I_2)_{Deg}=K_{Deg}(B_1-B_4)$ where $K_{Deg}$ is a constant determined during calibration
    5.3.2 If the absolute error of $(I_2)_{124}$ against $(I_2)_{Deg}$ is lower than $(I_2)_{134}$, then the magnetic field detector ASIC3 is faulty and the coupling matrix $K_{124}$ needs to be used. Otherwise, the magnetic field detector ASIC2 is faulty and the coupling matrix $K_{134}$ needs to be used (S7)

$((I_2)_{124}-(I_2)_{Deg})<((I_2)_{134}-(I_2)_{Deg})$

Figure 8:
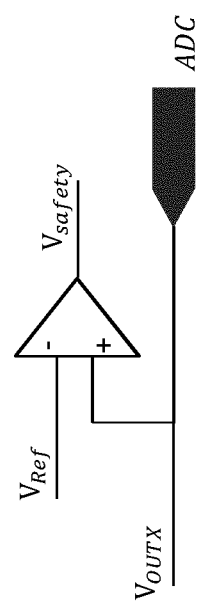
FIG. 8 is a schematic representation of a portion of a signal processing circuit of a current transducer according to embodiments of the invention, in particular illustrating a comparator function for detecting a fault.

To increase safety, electrical faults need to be detected quickly; but estimating currents takes too much time. To reach a quicker detection, comparators as illustrated in FIG. 8 may be implemented in the signal processing circuit to generate a control signal such as a switch off signal at specific voltage thresholds. When high currents are flowing in the current transducer, each current can be coarsely estimated only using the magnetic field detector closest to the corresponding primary conductor. Hence, voltage thresholds can be determined for each magnetic field detector to generate a shut down control signal for an externally controlled system in case of an electrical fault or overcurrent.

For example, $I_1 \approx k_1 \cdot V_4$ when $I_1$ is high (with a relative error from 5 to 10%); if the maximum current which shuts down the external system is $I_{1MAX}$, hence $$V_{4_{Ref}} = \frac{I_{1_{MAX}}}{k_1}.$$

A current transducer according to embodiments of the invention advantageously enables the provision of a compact and simple multi-phase current sensor (e.g. three phase current sensor).

The signal processing circuit of the transducer or in an external circuit connected to the current transducer, may advantageously be configured with at least two computation methods to estimate currents precisely: which may advantageously include a pseudo inverse method and a differential method.

The signal processing circuit of the transducer or in an external circuit connected to the current transducer, may advantageously further include a degraded mode of computation to estimate currents that allows detection of faults in the magnetic field detectors, leakage currents, or overcurrents.

LIST OF REFERENCES USED

Current Measurement System
  Current transducer 1
Housing 2
  housing parts
    base 2a
    cover 2b
    latching elements 12
    passages 11 for primary conductors
  mounting lugs 14
  magnetic core 3
  first and second core parts 3a, 3b
  magnetic field detectors 4, 4a, 4b, 4c, 4d, 4e, 4f
  ASIC
    ASIC1, ASIC2, ASIC3, ASIC4
    Hall effect detector
  circuit 5
  circuit board 7
    contact portions for detectors 16
    circuit traces
    contact portions for connector 18
  connector 8
  primary conductors 6
  phase conductors 6a, 6b, 6c
  computation unit

The invention claimed is:

1. A current measurement system comprising a multi-phase open loop current transducer for measuring phase currents ($I_1$, $I_2$, $I_3$) flowing in a plurality n of primary conductors of a multi-phase electrical system, the transducer comprising a housing, a magnetic core including a first magnetic core part and a second magnetic core part and a plurality n+1 of magnetic field detectors mounted in the housing between the first and second magnetic core parts in which portions of the primary conductors traversing the current transducer housing are positioned, the system further comprising a non-volatile memory in which information on at least one coupling matrix (K) of dimension [n+1]×n, pre-defined in a calibration procedure, is stored, said at least one coupling matrix (K) linking the phase currents ($I_1$, $I_2$, $I_3$) flowing in the primary conductors to magnetic induction fields ($B_1$, $B_2$, $B_3$, $B_4$) detected by said magnetic field detectors, and a computation unit configured to compute the values of said n phase currents from the outputs of said n+1 magnetic field detectors using the coupling matrix, wherein the computation unit is further configured to redundantly estimate the n phase currents in a degraded mode using n+1 degraded mode coupling matrices, each of dimension n×n based on the outputs of a subset of n of said n+1 magnetic field detectors taking into account all the n phase currents for each of the magnetic induction fields detected by said subset of magnetic field detectors, and detect faults in the magnetic field detectors, leakage currents, or overcurrents based on the redundantly estimated n phase currents.

2. The current measurement system according to claim 1, wherein said non-volatile memory in which information on at least one coupling matrix (K) is stored, is provided in at least one application specific integrated circuit (ASIC) forming at least one of said magnetic field detectors, or is provided in a memory of a circuit of the transducer.

3. The current measurement system according to claim 2, wherein said non-volatile memory in which information on at least one coupling matrix (K) is stored, is readable via a connector of the current transducer by an external circuit, for transmission of said information on said at least one coupling matrix to said external circuit and for computation of the values of the phase currents in said external circuit.

4. The current measurement system according to claim 1, wherein said non-volatile memory in which information on at least one coupling matrix (K) is stored is arranged in said electrical system externally to the transducer.

5. The current measurement system according to claim 1, further comprising a computation unit configured to execute at least two different computation methods to estimate currents, including for instance a pseudo inverse method such as the Moore-Penrose inverse computation and a differential method.

6. The current measurement system according to claim 1, wherein the first and second magnetic core parts are in the form of substantially straight rectangular bars formed of a stack of laminated soft magnetic material sheets.

7. The current measurement system according to claim 1, wherein each of the magnetic core parts is received in a respective housing part, that are formed as separate parts that are assembled together, one of the housing parts housing the plurality of magnetic field detectors and the primary conductor portions extending through the housing.

8. The current measurement system according to claim 1, wherein passages through which the primary conductors extend are formed by recesses or through-cavities in said one of the housing parts, the other housing part having an essentially planar mating face.

9. The current measurement system according to claim 1, wherein the transducer comprises a circuit board arranged in a plane substantially orthogonal to the plane (P) in which the airgap between said magnetic core parts is formed, along a side of the housing that overlaps connection terminals of the magnetic field detectors.

10. The current measurement system according to claim 1, wherein the magnetic field detectors are pre-assembled to the circuit board during manufacturing, whereby during assembly of the circuit board against the housing base part, the magnetic field detectors are inserted into cavities in the housing part for receiving the magnetic field detectors, said cavities including cavities positioned on either outer side of the primary conductors and cavities between adjacent primary conductors.

11. The current measurement system according to claim 1, wherein the transducer is for a three-phase electrical system and comprise four magnetic field detectors being arranged on outer sides of the three primary conductors and each of the other two being arranged between respective adjacent primary conductors.

12. The current measurement system according to claim 1, wherein the magnetic field detectors are in the form of ASICs.

13. The current measurement system according to claim 1, comprising a comparator connected to each magnetic field detector configured to generate a control signal at specific voltage thresholds determined for each magnetic field detector to generate a shut down control signal for an electrical system controlled by the current in case of an electrical fault or overcurrent.

14. A method of measuring a plurality of currents ($I_1$, $I_2$, $I_3$) flowing in a plurality n of primary conductors of a multi-phase electrical system, comprising:

providing a current measurement system comprising a transducer including a housing, a magnetic core including a first magnetic core part and a second magnetic core part, and a plurality n+1 of magnetic field detectors mounted in the housing between the first and second magnetic core parts in which portions of the primary conductors traversing the current transducer housing are positioned, the transducer connected to a circuit of the multi-phase electrical system;

executing, prior to operation of the transducer for measuring said phase currents flowing in said primary conductors, a calibration method to compute at least one coupling matrix (K) of dimension [n+1]×n linking the phase currents ($I_1$, $I_2$, $I_3$) flowing in the primary conductors to magnetic induction fields ($B_1$, $B_2$, $B_3$, $B_4$) detected by said magnetic field detectors;

storing said at least one coupling matrix in a non-volatile memory of the transducer or of said circuit of the multi-phase electrical system;

computing, in a computation unit of the current measurement system, during operation of the transducer for measuring said phase currents flowing in said primary conductors, the values of said n phase currents from measurement outputs of said n+1 magnetic field detectors using said at least one coupling matrix;

computing, in said computation unit, a redundant measurement of the plurality of currents ($I_1$, $I_2$, $I_3$) using n+1 degraded mode coupling matrixes of dimension n×n to detect faults in the magnetic field detectors, n among n+1 magnetic field detectors for an n phase system being used to compute the n+1 degraded mode coupling matrixes ($K_{123}$ $K_{124}$ $K_{134}$ $K_{234}$) taking into account all the n phase currents for each of the magnetic induction fields detected by said magnetic field detectors.

15. The method of claim 14, wherein a computation unit of a circuit of the current measurement system executes a differential measurement for each phase current, where the coupling matrix K' for the differential measurement is determined with the calibration method.

* * * * *